(12) United States Patent
Ratchkov et al.

(10) Patent No.: US 6,545,288 B1
(45) Date of Patent: Apr. 8, 2003

(54) GRIDLESS ROUTER USING MAZE AND LINE PROBE TECHNIQUES

(75) Inventors: Radoslav Ratchkov, San Jose, CA (US); Anand Sethuraman, San Jose, CA (US)

(73) Assignee: LSI Logic Corporation, Milpitas, CA (US)

(*) Notice: Subject to any disclaimer, the term of this patent is extended or adjusted under 35 U.S.C. 154(b) by 49 days.

(21) Appl. No.: 09/802,043

(22) Filed: Mar. 8, 2001

(51) Int. Cl.[7] ............................................... G06F 17/50
(52) U.S. Cl. ......................................................... 257/12
(58) Field of Search ................................. 716/12–14, 2

(56) References Cited

U.S. PATENT DOCUMENTS 6,182,272 B1 * 1/2001 Andreev et al. ............... 716/13
6,412,102 B1 * 6/2002 Andreev et al. ............... 716/12

OTHER PUBLICATIONS

Lee, C.Y., "An Algorithm For Path Connections and Its Applications", IRE Transactions on Electronic Computers, VEC–10, pp. 346–365, Sep., 1961.

Korn, Robert K., "An Effective Variable–Cost Maze Router" 19th Design Automation Conference, pp. 425–431, Jun. 1982.

Knuth, Donald, "The Art of Computer Programming", vol. 3, pp. 458–475, published earlier than Mar. 8, 2001.

* cited by examiner

Primary Examiner—Cuong Quang Nguyen
(74) Attorney, Agent, or Firm—Trexler, Bushnell, Giangiorgi, Blackstone & Marr, Ltd.

(57) ABSTRACT

A software tool and method for routing paths in a routing space. A grid is effectively built "on the fly", therefore reducing the number of grid points which must be plotted. The boundaries of the routing space are defined. Blocks are then defined in the routing space. After the blocks have been defined, grid points are plotted corresponding to the corners of the blocks. The source points and target points are plotted, and grid points are plotted corresponding to the source and target points. Then, the paths from the source points to the target points are plotted along grid points which have been defined in the routing space. This process of defining the grid points not only reduces the size of data needed to describe the available routing space, but preferably obviates the need to run design rule checks.

20 Claims, 10 Drawing Sheets

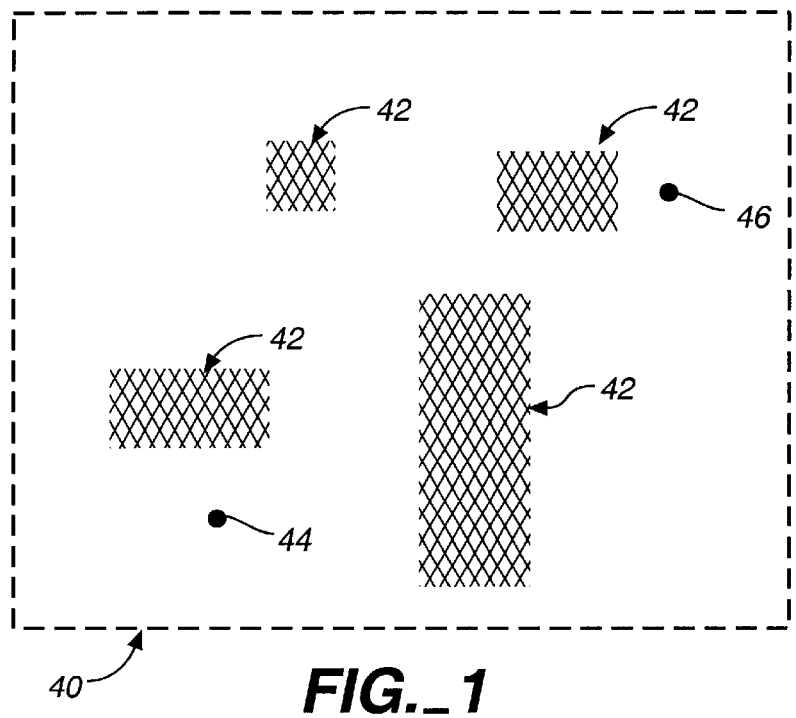
FIG._1
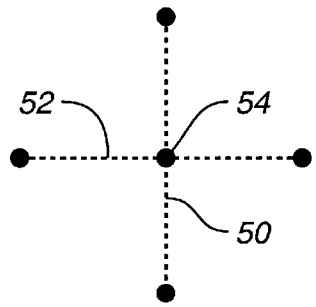
FIG._2
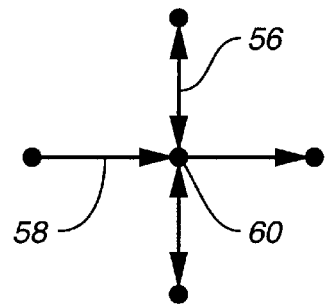
FIG._3
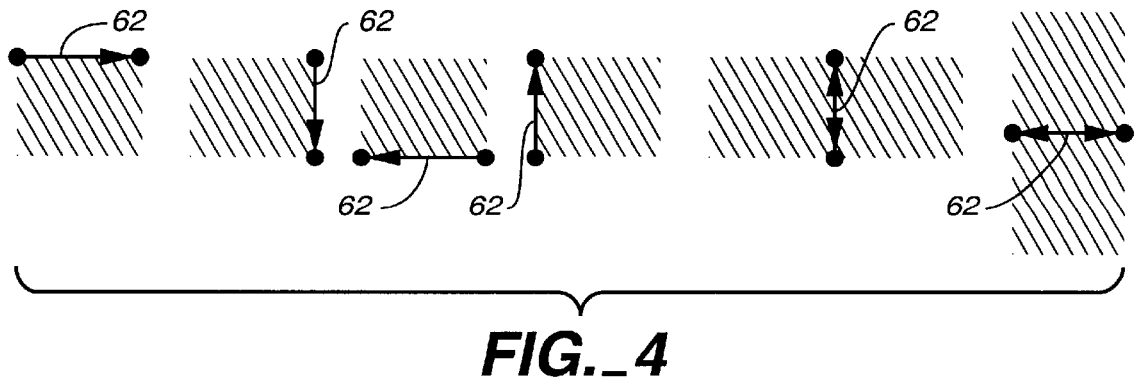
FIG._4

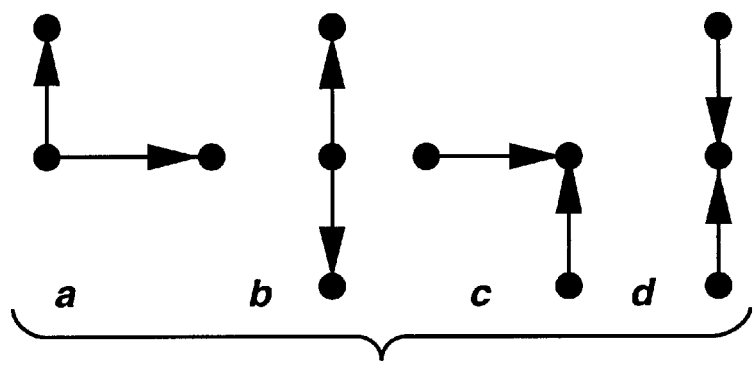
FIG._5
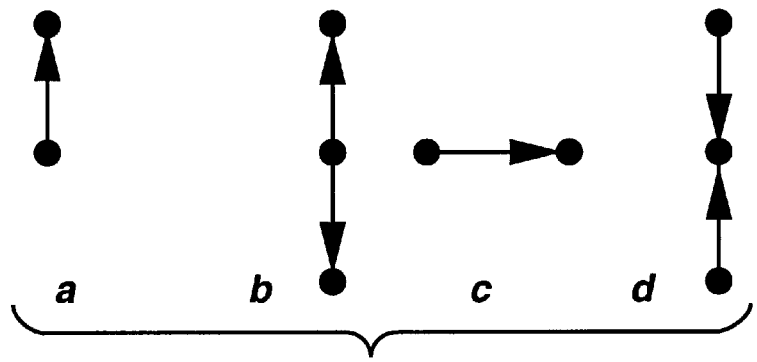
FIG._6
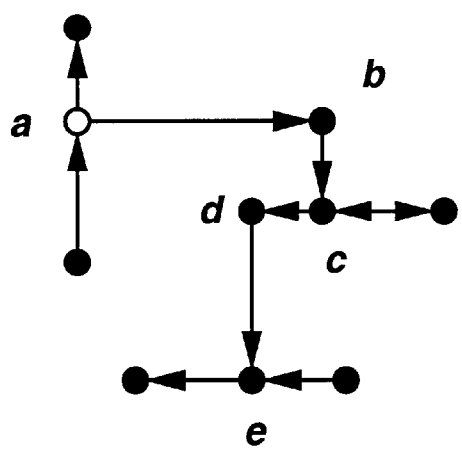
FIG._7
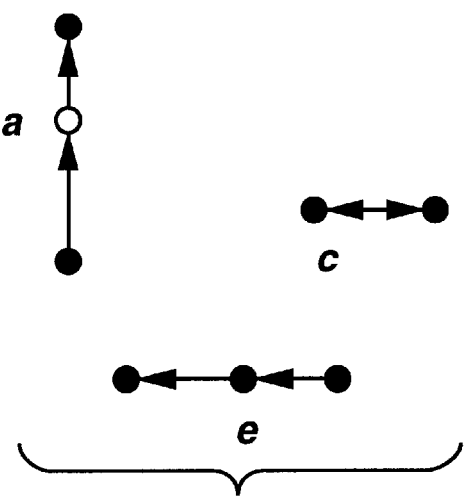
FIG._8

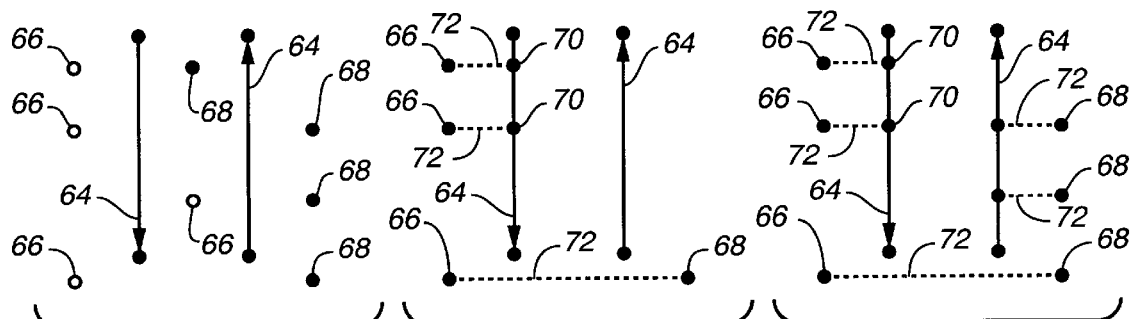
FIG._9  FIG._10  FIG._11
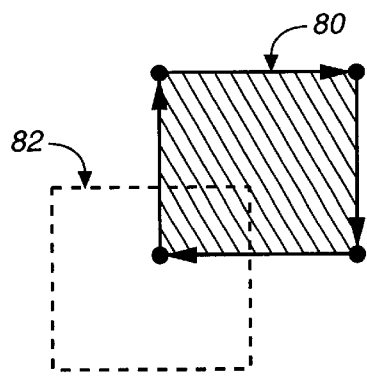
FIG._12
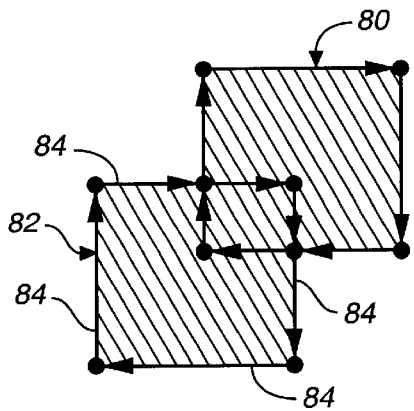
FIG._13
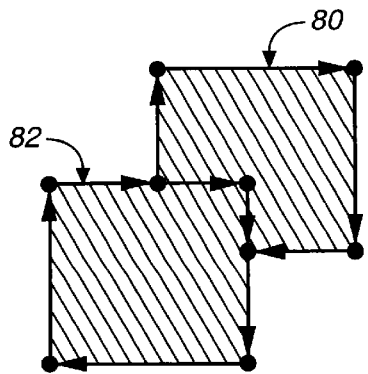
FIG._14
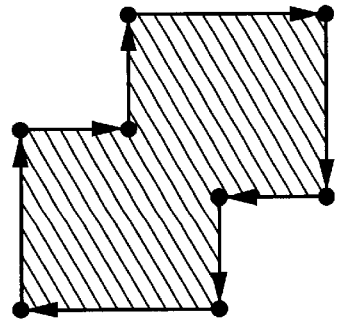
FIG._15

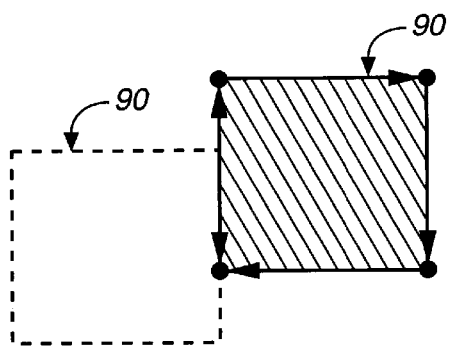
FIG._16
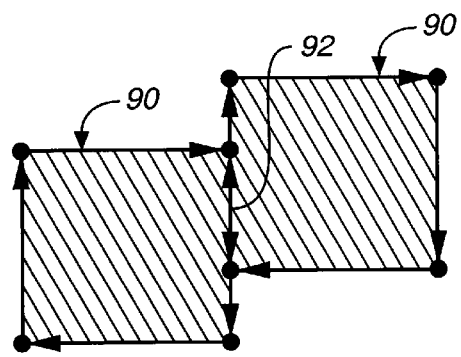
FIG._17
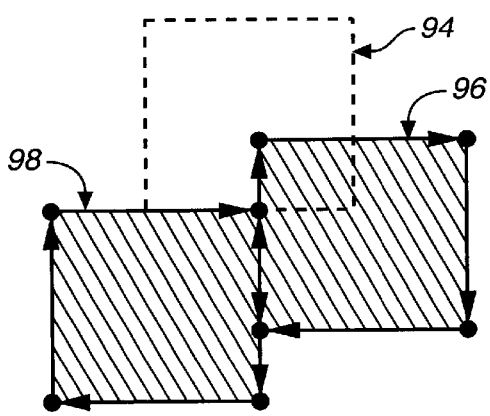
FIG._18
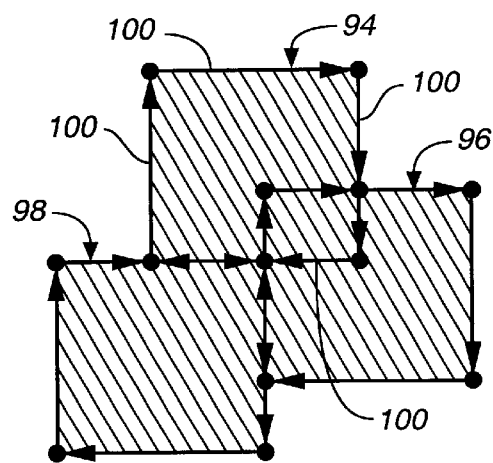
FIG._19
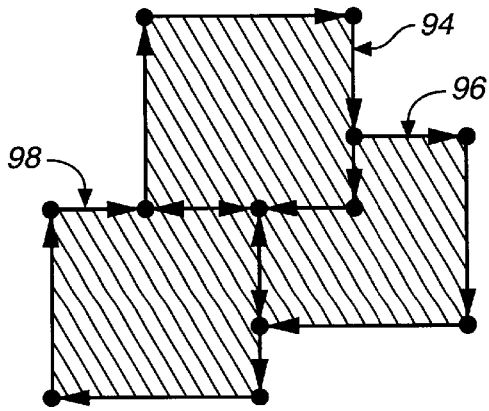
FIG._20
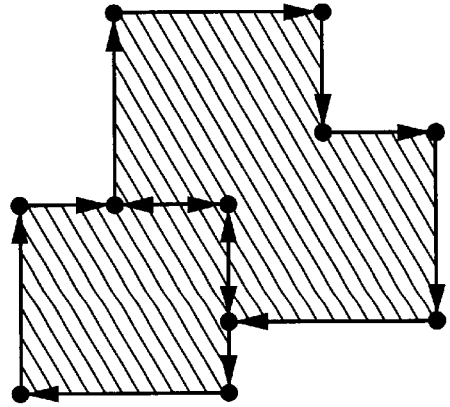
FIG._21

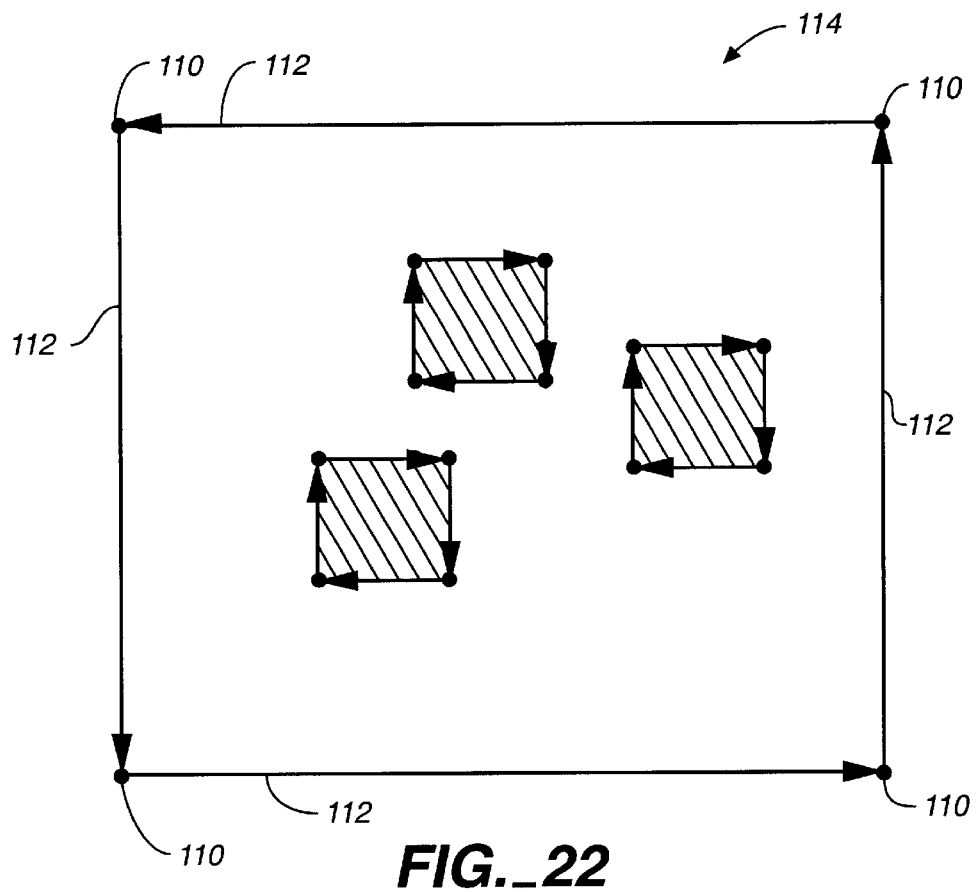
FIG._22
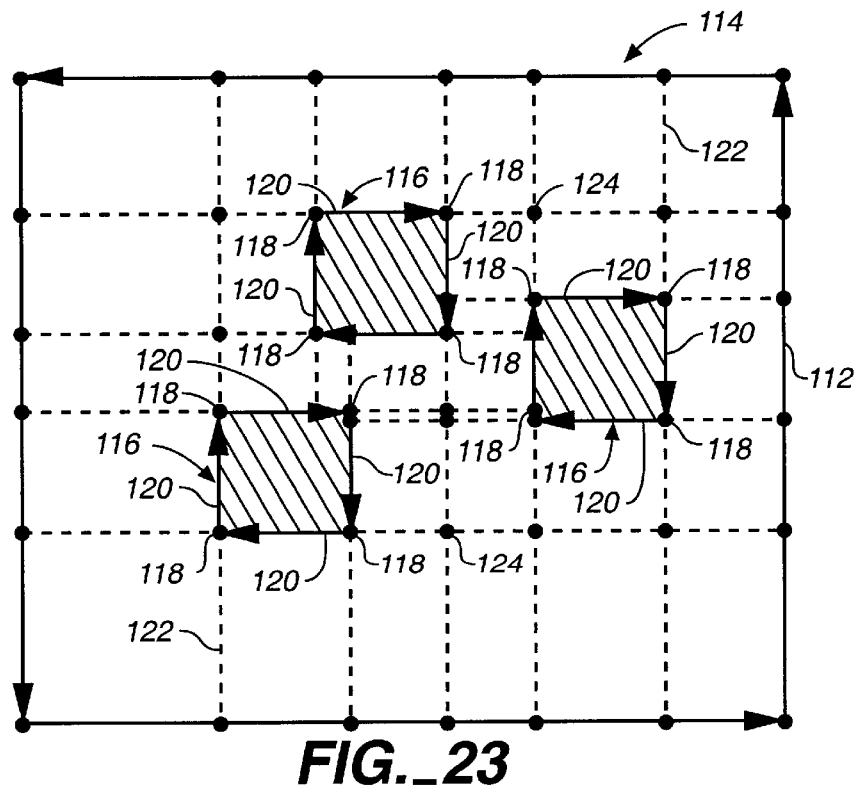
FIG._23

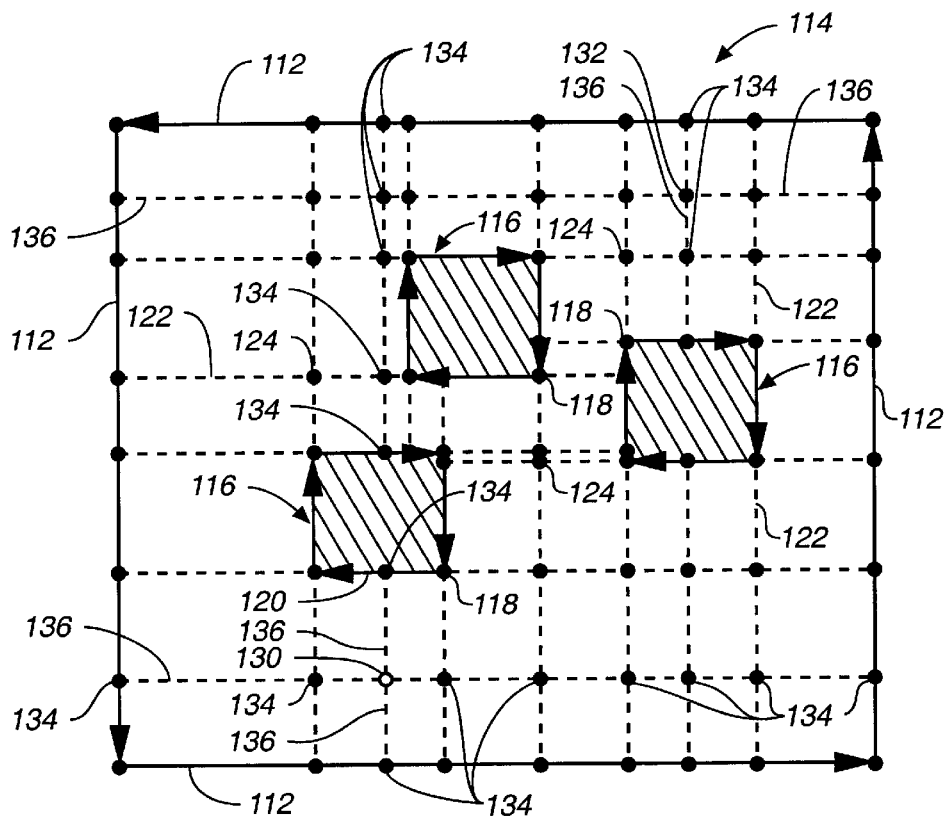
FIG._24
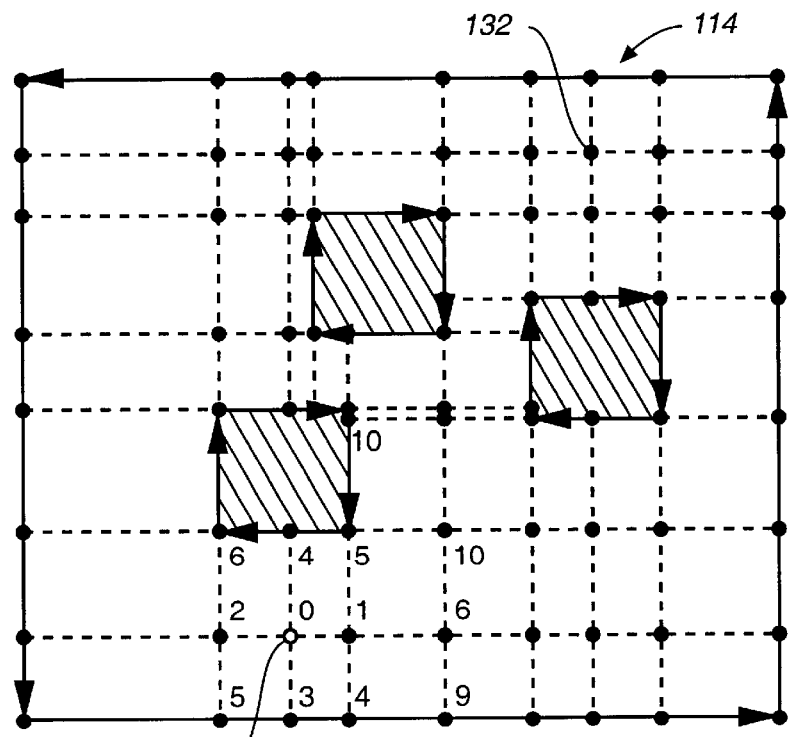
FIG._25

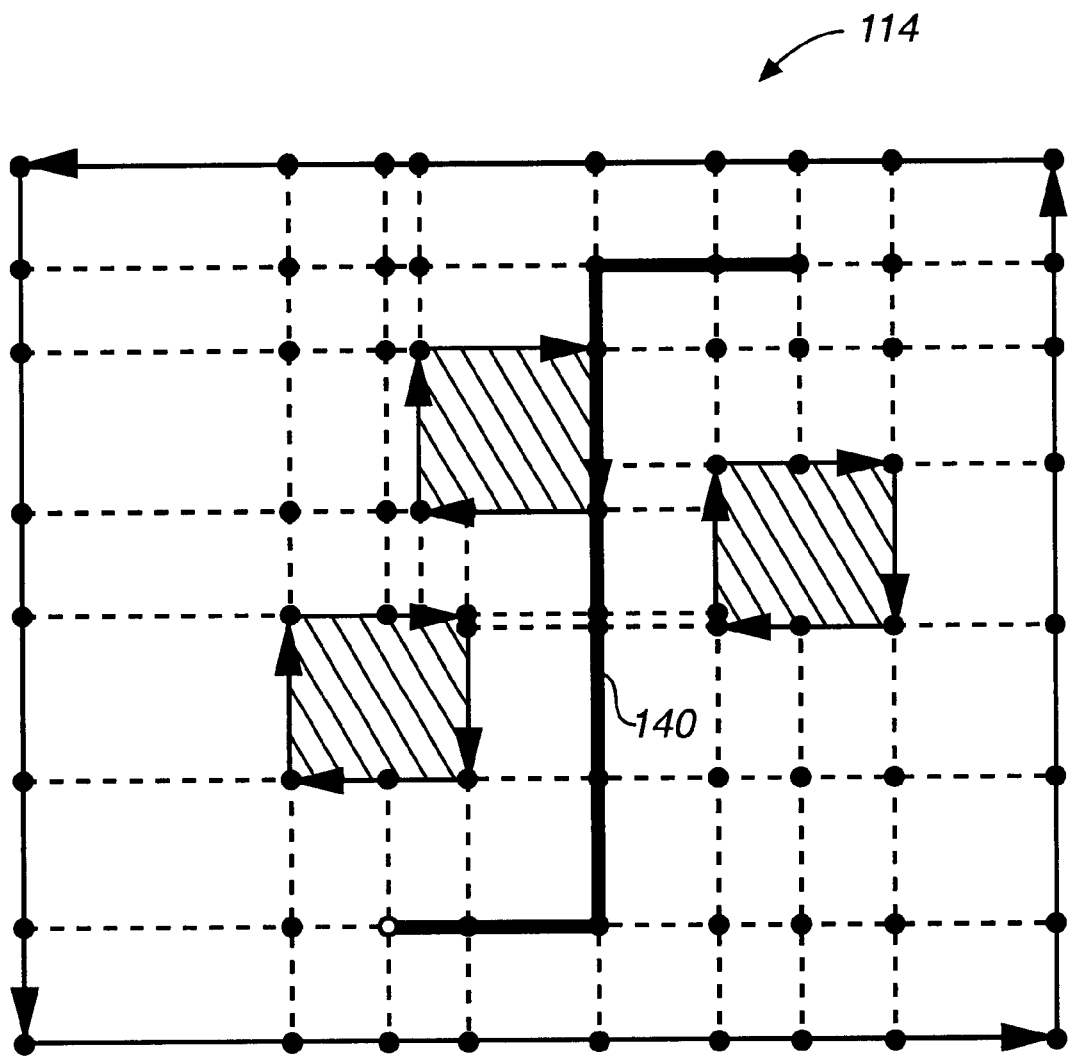
FIG._26

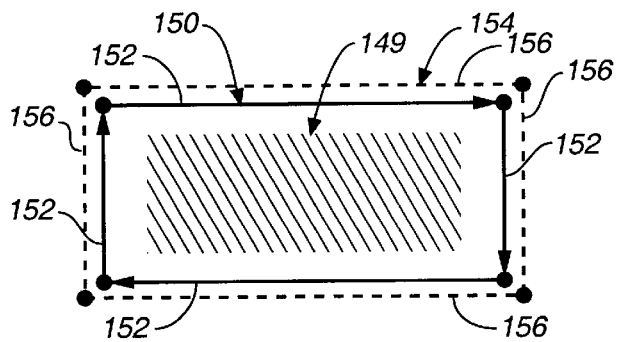
FIG._27
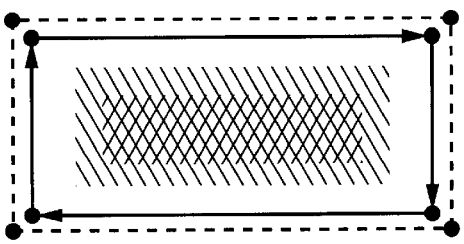
FIG._28
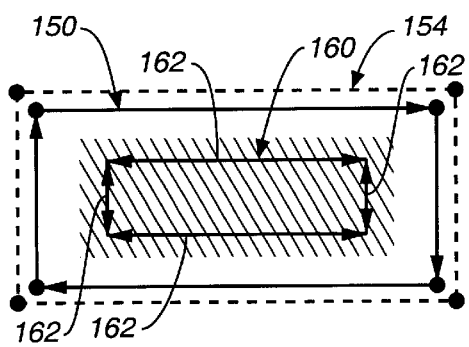
FIG._29
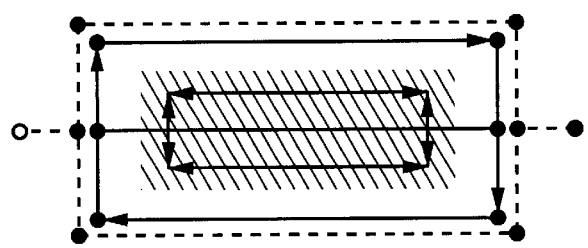
FIG._30
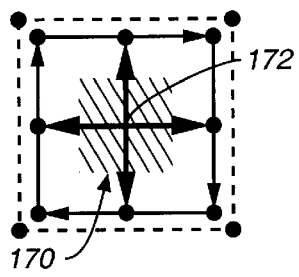
FIG._31
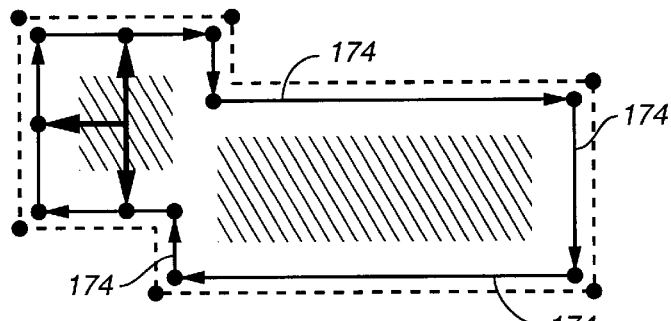
FIG._32

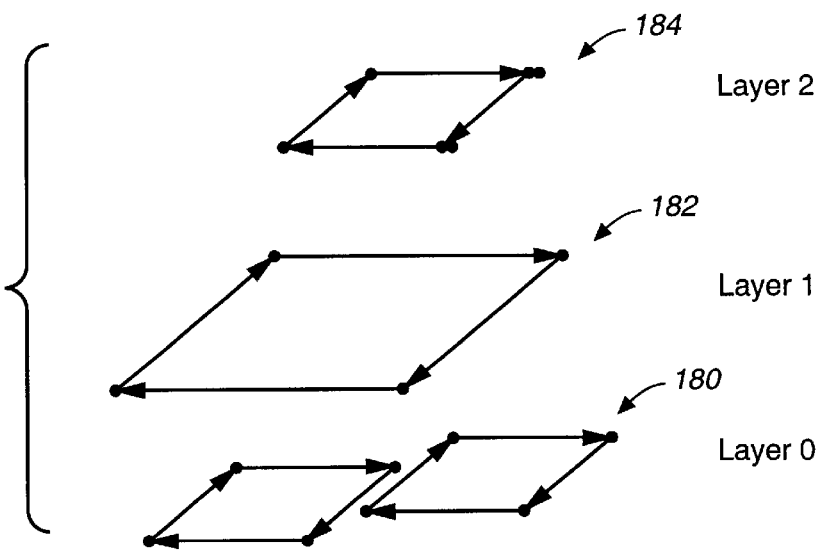
FIG._33
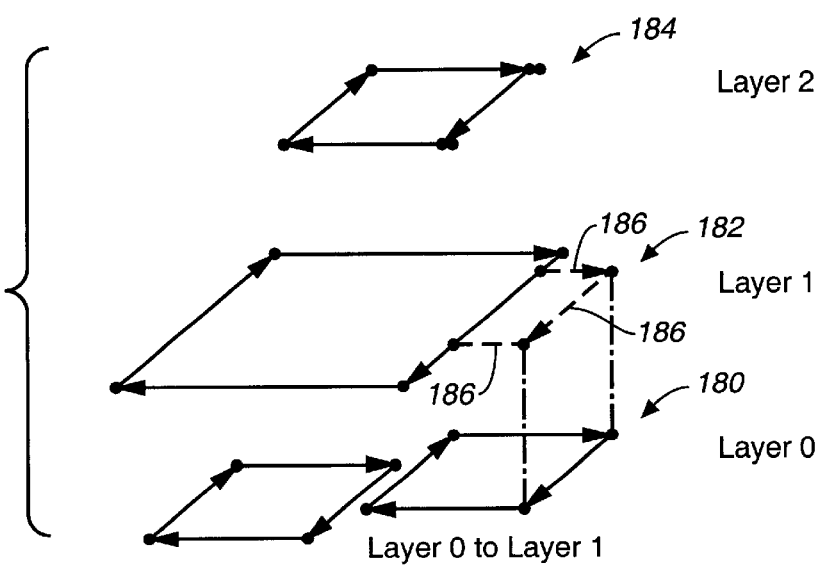
FIG._34
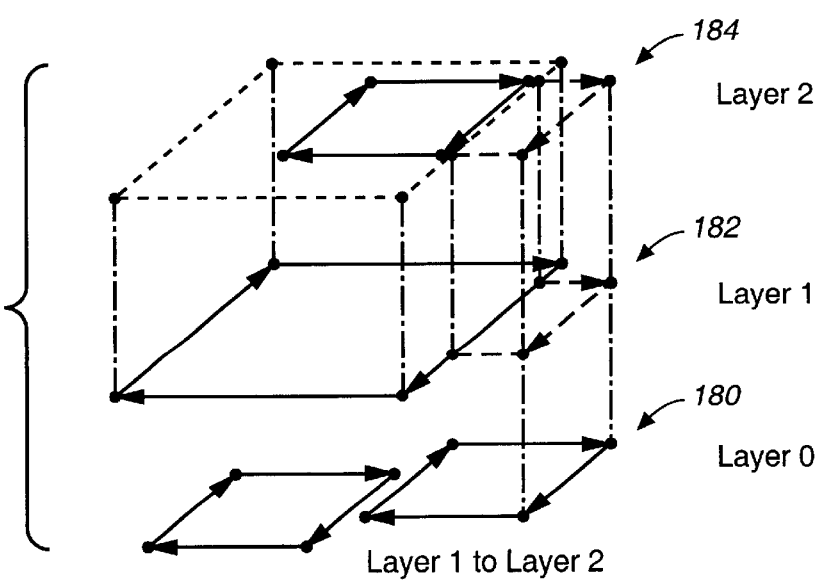
FIG._35

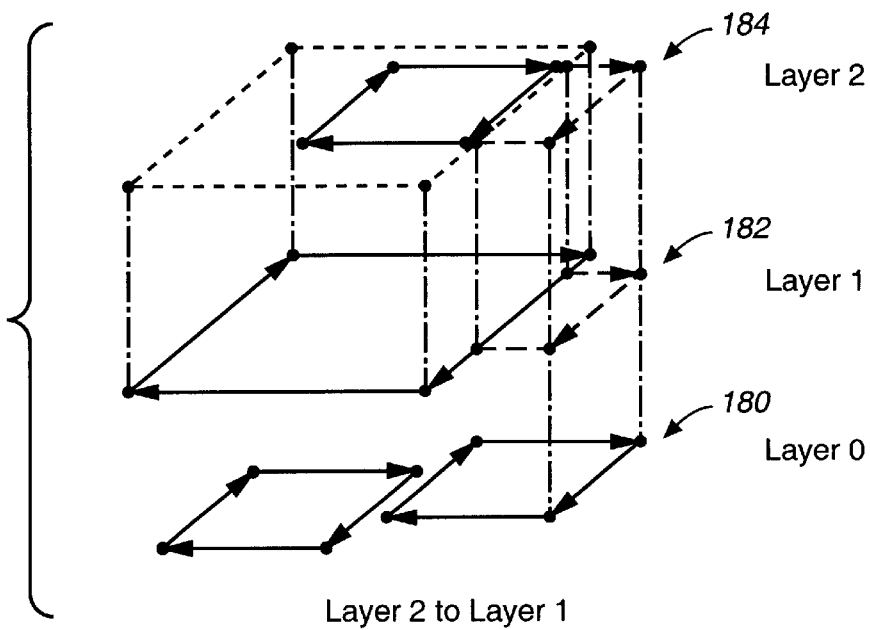
FIG._36
Layer 2 to Layer 1
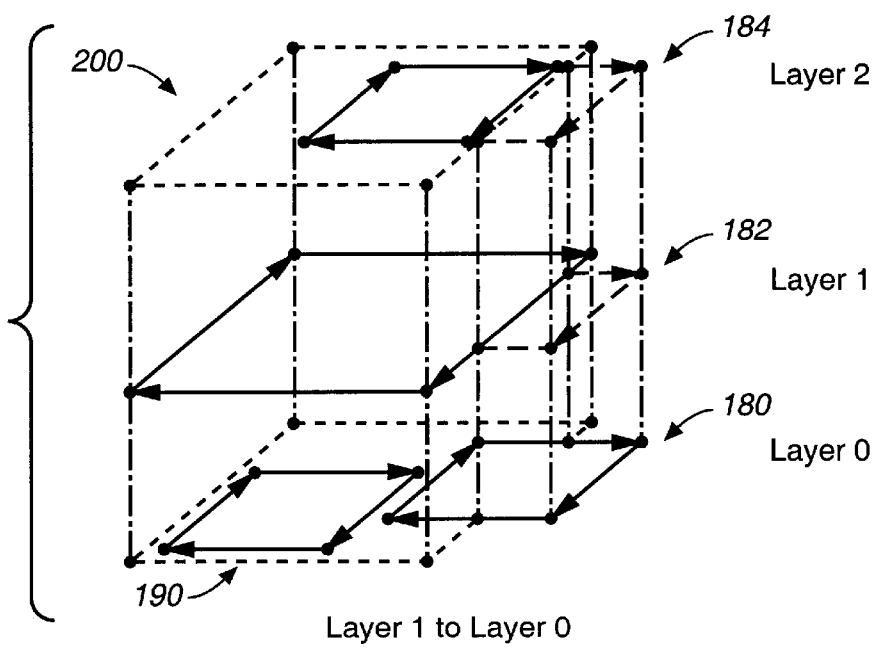
FIG._37
Layer 1 to Layer 0

GRIDLESS ROUTER USING MAZE AND LINE PROBE TECHNIQUES

BACKGROUND

This invention generally relates to maze routers and routing methods, and more specifically relates to a router and method which reduces the amount of data needed to plot routing space and determine a route therein.

It is common to use software tools and plotting methods (i.e. maze routers) to design routes or paths from targets to sources in a routing space. Such tools and methods are used to quickly plot out efficient routes in the routing space, where the routing space contains obstructions or the routes must meet certain design criteria. For example, it is common to use a maze router to route vias and wire paths from sources to targets in a multiple layer routing space.

One known algorithm for determining routes in a routing space is disclosed in Lee, C. Y., "An Algorithm for Path Connections and Its Applications", IRE Transactions on Electronic Computers, VEC-10, pp.346–365, September 1961. Lee discloses plotting a grid to define the routing space, and then analyzing the grid points from a source to a target to determine the best route. Unfortunately, because Lee plots all the grid points in the grid which form the routing space, Lee requires that much data be used to define a given routing space. This is true even if the routing space contains little or no obstructions (i.e. blocks) and is generally a wide open space. With Lee, the size of the representation (i.e. the data which is needed to represent) of the routing space depends on the actual size of the routing space, regardless of the number of obstructions (i.e. blocks) in the routing space.

Lee also requires that to effectively go around a block, several steps must be attempted until the block can be cleared. Obviously, this consumes processing time, and may cause the router to take a long time to calculate the routes. For example, the number of steps which must be attempted to go East when a block is in the way will depend on the size of the block. Specifically, a step to the North or South is taken, and an attempt is made to turn East. If the block is still in the way, another step to the North or South is taken, and another attempt is made to turn East. The process is repeated until a turn can be made to the East. By having to attempt so many steps to go around a block, processing time is consumed, and performance of the router suffers.

Lee also does not take into account design rules while plotting the grid. Hence, after using the Lee algorithm to route paths, design rule checks (DRC) must be performed to ensure that the proposed design is acceptable. Additionally, Lee does not take into consideration any costs which are associated with the routes which are calculated.

Korn, Robert K., "An Efficient Variable-Cost Maze Router", 19th Design Automation Conference, pp. 425–431, June 1982 discloses a maze routing algorithm which does take cost into account. However, other than accounting for costs, which Lee does not do, Korn provides many of the same disadvantages as Lee provides.

OBJECTS AND SUMMARY

A general object of an embodiment of the present invention is to provide a maze router and method which reduces the size of data which is needed to define routing space.

Another object of an embodiment of the present invention is to provide a maze router and method which obviates the need to run design rule checks after routes have been plotted.

Still another object of an embodiment of the present invention is to provide a maze router and method which takes less processing time (i.e. less time to plot routing space, and less time to determine routes in the routing space).

Briefly, and in accordance with at least one of the foregoing objects, an embodiment of the present invention provides a software tool and/or method for routing paths in a routing space. A grid is effectively built "on the fly", therefore reducing the number of grid points which must be plotted. The boundaries of the routing space are defined. Blocks are then defined in the routing space. After the blocks have been defined, grid points are plotted corresponding to the corners of the blocks. The source points and target points are plotted, and grid points are plotted corresponding to the source and target points. Then, the paths from the source points to the target points are plotted along grid points which have been defined in the routing space. This process of defining the grid points not only preferably reduces the size of data needed to describe the available routing space, but preferably obviates the need to run design rule checks.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which:

FIG. 1 is a schematic view of routing space with blocks;

FIG. 2 is a schematic view illustrating intersecting regular edges;

FIG. 3 is a schematic view illustrating a bi-directional boundary edge intersected with a one-directional boundary edge;

FIG. 4 is a schematic view illustrating boundary edges and the block space they represent;

FIG. 5 is a schematic view illustrating four different sets of grid points and boundary edges, where unnecessary grid points and boundary edges have not yet been removed;

FIG. 6 is a schematic view similar to FIG. 5, but showing the unnecessary grid points and boundary edges removed;

FIG. 7 is a schematic view illustrating a set of grid points and boundary edges, where unnecessary grid points and boundary edges have not yet been removed;

FIG. 8 is a schematic view similar to FIG. 7, but showing the unnecessary grid points and boundary edges removed;

FIG. 9 is a schematic view illustrating two boundary edges and a plurality of source and target points;

FIG. 10 is a schematic view similar to FIG. 9, illustrating the creation of grid points and regular edges (based on the source points shown in FIG. 9) using "normal" creation;

FIG. 11 is a schematic view similar to FIG. 9, illustrating the creation of grid points and regular edges (based on the source and target points shown in FIG. 9) using "forced" creation;

FIG. 12 is a schematic view illustrating a previously created block, and an intersecting block which is about to be represented (shown using dashed lines);

FIG. 13 is a schematic view showing the first step in representing a block which intersects another block—the plotting of the grid points and boundary edges;

FIG. 14 is a schematic view showing the second step in representing a block which intersects another block— removal of grid points and boundary edges disposed within the newly-added block;

FIG. 15 is a schematic view showing the third step in representing a block which intersects another block—removal of any unnecessary grid points and boundary edges;

FIG. 16 is a schematic view illustrating a previously created block, and an adjacent block which is about to be represented (shown using dashed lines);

FIG. 17 is a schematic view showing the first (and only) step in representing a block which is adjacent to another block—the plotting of the grid points and boundary edges;

FIG. 18 is a schematic view illustrating two previously created blocks, and a third block which is about to be represented (shown using dashed lines);

FIG. 19 is a schematic view showing the first step in representing the new block—the plotting of the grid points and boundary edges;

FIG. 20 is a schematic view showing the second step in representing the new block—removal of grid points and boundary edges disposed within the newly-added block;

FIG. 21 is a schematic view showing the third step in representing the new block—removal of any unnecessary grid points and boundary edges;

FIG. 22 is a schematic view showing a boundary space with three blocks;

FIG. 23 is a schematic view similar to FIG. 22, showing grid points corresponding to corners of the blocks;

FIG. 24 is a schematic view similar to FIG. 23, showing a source point and target point, and grid points corresponding to the source and target points;

FIG. 25 is a schematic view similar to FIG. 24, showing distances assigned to some of the grid points proximate the source point;

FIG. 26 is a schematic view similar to FIG. 25, showing a route which has been plotted between the source and target points, along grid points which have been plotted in the routing space;

FIG. 27 is a schematic view of a wire block which has been created;

FIG. 28 is a schematic view of a via block which has been created;

FIGS. 29 and 30 are schematic views together showing the creation of a source/target block;

FIGS. 31 and 32 are schematic views together showing creation of a block for a source/target point;

FIG. 33 is a schematic view showing three layers of blocks;

FIG. 34 is a schematic view similar to FIG. 33, showing the first step in merging the layers to have a multi-layer representation—merging the bottom layer (Layer 0) to the middle layer (Layer 1);

FIG. 35 is a schematic view similar to FIG. 34, showing the second step in merging the layers—merging the middle layer (Layer 1) to the top layer (Layer 2);

FIG. 36 is a schematic view similar to FIG. 35, showing the third step in merging the layers—merging the top layer (Layer 2) to the middle layer (Layer 1);

FIG. 37 is a schematic view similar to FIG. 36, showing the fourth step in merging the layers—merging the middle layer (Layer 1) to the bottom layer (Layer 0).

DESCRIPTION

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

An embodiment of the present invention provides a maze router and method which reduces the size of data which is needed to define routing space. Additionally, the router and method obviates the need to run design rule checks after the routes have been plotted. Preferably, the router and method takes less processing time (i.e. less time to plot routing space, and less time to determine routes in the routing space). These and other advantages will become apparent from reviewing the following description.

Shown in FIG. 1 is a routing space 40, and four blocks 42 contained in the routing space. Also shown is a source point 44 (i.e. starting point) and target point 46 (i.e. ending point). To find an acceptable route from the source point 44 to the target point 46, one must define a way around each block 42 existing in the routing space 40 (i.e. the route must not cross any of the blocks 42), and the route must begin at the source point 44 and end at the target point 46. Because these are the two rules which must be followed to determine an acceptable route, there is no need to plot out every possible grid point in the routing space 40. Hence, the data needed to represent a routing space can be reduced (as compared to Lee, described above).

In accordance with the present invention, a routing space has two elements—grid points and routing edges. A routing edge defines a route between two grid points, without intersecting any other edges. Each grid point defines a place where routing can change direction. There are two general types of routing edges—a regular edge and a boundary edge. Both types of edges are created between (i.e. defined by) two grid points. Regardless of which type of edge an edge is, if an edge intersects another edge, a grid point is created. FIG. 2 shows a first regular edge 50 intersecting a second regular edge 52, and a grid point 54 created by the intersection. FIG. 3 shows a bi-directional boundary edge 56 intersecting a one-directional boundary edge 58, and a grid point 60 created by the intersection. As will become more apparent later in the following description, exact behavior at a given intersection grid point is defined by the type of edges which intersect.

The purpose of a boundary edge is to define a block (i.e. an area in which routing is not allowed). The direction of the boundary edge (i.e. the direction the boundary edge points) defines on which side of the boundary edge the block is defined. For example, as shown in FIG. 4, the block may be defined as being, following the direction of the boundary edge, to the right of the boundary edge 62 (wherein the two right-most examples show boundary edges which point in both directions (bi-directional boundary edges), hence a block is created on both sides).

The process of creating a boundary edge includes two steps. First, the boundary edge is created from a starting grid point to an ending grid point, where all intersections with other boundary edges are specially marked. Then, the specially marked points are processed, and any unneeded boundary edges are removed. This step is necessary because no other edge can be to the right of a boundary edge. The maximum number of boundary edges "outgoing" from a grid point is two, and the maximum number of boundary edges "incoming" to a grid point is two. Additionally, both numbers must be equal, i.e. if there is one "incoming" boundary edge, there can only be one "outgoing" boundary edge. Bi-directional boundary edges interesecting a grid point can be any number since each bi-directional boundary edge specifies one "incoming" boundary edge and one "outgoing" boundary edge.

When removing unnecessary boundary edges, there are four different cases which can be split into two groups—removing "incoming" boundary edges and removing "outgoing" boundary edges. All other cases can be derived from the four cases by rotating or combining. Because bi-directional boundary edges represent an "incoming" and an "outgoing" boundary edge, bi-directional boundary edges are not part of the processing of (i.e. removal of) specially marked intersection points. FIG. 5 shows the four different cases, labelled case "a", "b", "c" and "d". FIG. 6 shows the four cases after processing, i.e. after unnecessary boundary edges and grid points have been removed. All other cases can be derived from the four cases shown in FIGS. 5 and 6 by rotating or combining.

The process of removing unneeded boundary edges and grid points is closely associated with the fact that a block is enclosed by four boundary edges. Once an edge and associated grid point is removed, all the edges which are connected to it are also removed, following either its direction if the edge was an "outgoing" edge, or the opposite direction if the edge was an "incoming edge", until there are no other boundary edges connected to the edge.

FIG. 7 shows an arrangement of grid points and boundary edges before processing (i.e. before unnecessary grid points and boundary edges are removed), while FIG. 8 shows the arrangement after processing (i.e. after unnecessary grid points and boundary edges have been removed). With reference to FIG. 7, initally grid point "a" has two "outgoing" and one "incoming" boundary edge. Because there must be the same number of "incoming" and "outgoing" boundary edges, one "outgoing" boundary edge must be removed. The "outgoing" boundary edges which intersect point "a" provide case "a" shown in FIGS. 5 and 6. Hence, the "outgoing" edge pointing to the east (from "a" to "b") should be removed. After processing, point "b" in FIG. 7 has only one boundary edge, an "outgoing" edge (pointing downward to point "c"). Because there must be the same number of "incoming" and "outgoing" boundary edges, and there is no "incoming" boundary edge, the "outgoing" boundary edge from "b" to "c" must be removed. After removing this boundary edge, point "c" has one "outgoing" boundary edge and one bi-directional boundary edge. As discussed above, bi-directional boundary edges are no deleted, hence the "outgoing" boundary edge (from "c" to "d") must be removed. After processing, point "d" in FIG. 7 has only one boundary edge, an "outgoing" boundary edge (pointing downward to point "e"). Because there must be the same number of "incoming" and "outgoing" boundary edges, and there is no "incoming" boundary edge, the "outgoing" boundary edge from "d" to "e" must be removed. Moving to point "e", after the boundary edge from point "d" to point "e" is removed, point "e" has one "incoming" and one "outgoing" boundary edge. Hence, processing is complete, and the end result looks as shown in FIG. 8. Of course, the result would be the same if processing began at point "e" and proceeded to point "a". Processing boundary edges (i.e. removing unneeded boundary edges and grid points) is imporatnt because it reduces the amount of data needed to represent the blocks which are contained in a routing space.

As discussed above, there are two types of edges—a boundary edge and a regular edge. While a boundary edge has a direction (thereby defining on which side of the boundary edge a block is located), a regular edge does not. A regular edge is an edge defined by two grid points—a starting point and an ending point. As will become more apparent below, regular edges result from plotting grid points in the routing space. Such grid points may correspond to a source point, a target point or corners of a block.

At times, a regular edge may intersect a boundary edge. FIG. 9 shows two boundary edges 64 and four pairs of starting (66) and ending (68) points for defining regular edges. There are two methods of creating a regular edge with respect to boundary edges—"normal" creation and "forced" creation. FIG. 10 shows "normal" creation. With "normal" creation, if a non right turn boundary edge is reached, no regular edge is created at all (because the regular edge, if created, would be inside the block). If a right turn boundary edge is reached (i.e. effectively a comer of a block), only a portion of the regular edge 72, from the starting point 66 to the boundary edge 64 (to point 70), is created. FIG. 11 shows "forced" creation. With "forced" creation, a regular edge 72 is defined beyond a boundary edge 64, but is not defined between boundary edges.

Each block is represented with four grid points connected together with boundary edges. FIGS. 12–15 illustrate a three step process of merging intersecting blocks. FIG. 12 illustrates the two blocks—a first block 80 (solid lines) which has been previously defined, and a second block 82 (dashed lines) which is to be defined. FIG. 13 shows the first step—all the boundary edges 84 of the new block 82 are defined. FIG. 14 shows the second step—all grid points and routing edges in the new block 82 are removed. FIG. 15 shows the third step—all specially marked points are processed to remove all unneeded routing edges and grid points (see FIGS. 5–8 and foregoing description).

FIGS. 16–17 illustrate the process of defining adjacent blocks 90. As shown in FIG. 17, the edge 92 common for both blocks is a bi-directional boundary edge. Creation of adjacent blocks follows the same steps as intersecting blocks, except that the bi-directional boundary edge is not removed.

FIGS. 18–21 illustrate a three step process of defining a new block 94 where the new block 94 intersects a first block 96 which has already been defined and will be adjacent to a second block 98 which has already been defined. FIG. 18 illustrates the three blocks—the first two blocks 96, 98 (solid lines) which have been previously defined, and a third block 94 (dashed lines) which is to be defined. FIG. 19 shows the first step—all the boundary edges 100 of the new block 94 are defined. FIG. 20 shows the second step—all grid points and routing edges in the new block 94 are removed. FIG. 21 shows the third step—all specially marked points are processed to remove all unneeded routing edges and grid points (see FIGS. 5–8 and foregoing description). Processing blocks in this manner (i.e. removing unneeded boundary edges and grid points) is imporatnt because it reduces the amount of data needed to represent the blocks which are contained in a routing space.

Now that basic aspects of processing grid points and edges a have been described, a specific example of defining routing space, blocks, grid points and a route will now be described. Initially, the routing space is defined. To simplify, the routing space may be assumed to be rectangular, in which case the routing space can be represented with four grid points, one for each corner of the space. As shown in FIG. 22, all four points 110 are connected with boundary edges 112, together pointing in a counter-clockwise direction, to form a closed rectangle 114. Hence, the routing space 114 is actually a result of creating four different intersecting blocks (the corners of each block intersect to define the corners 110 of the routing space 114) with infinite width, thereby preventing routing outside the window (i.e. outside the routing space 114).

After the routing space 114 is defined, blocks 116 are created in the routing space 114. As shown in FIG. 22, the blocks 116 are created using grid points 118 and boundary edges 120. The boundary edges 120 effectively connect the grid points 118 and define the blocks 116. As shown in FIG. 23, after the blocks 116 have been created, regular edges 122 are defined corresponding to the corners 118 of the blocks 116. In other words, grid points 124 are plotted in the routing space, where the grid points 124 correspond to the corners 118 of the blocks 116. As shown, "normal" creation is used. Hence, the regular edges 122 do not extend beyond boundary edges 120 of the blocks 116. As shown, the regular edges 122 and intersecting grid points 124 can be effectively drawn by drawing lines from each box corner 118 to each edge 112 of the routing space 114, where each line 122 ends when it contacts a boundary edge 120 or the edge 112 of the routing space 114. Grid points 124 are defined wherever a line 122 intersects either another line 122, a boundary edge 120 or an edge 112 of the routing space 114. By using this process, a grid point will not be connected to another grid point, through an existing block 116.

As shown in FIG. 24, once the grid points (and regular edges) corresponding to the corners of the blocks have been defined, the source (130) and target (132) points are plotted and grid points 134 corresponding to the source and target points are plotted. Specifically, the source and target points are plotted and then four regular edges 136 (one in each direction) is created for each source and target point. Each regular edge starts at the source or target point and continues to the respective edge 112 of the routing space using "forced" creation. Hence, the regular edge 136 continues after a block 116 has been cleared. The purpose for using "forced" creation is to facilitate multi-layer routing which will be described in more detail later herein.

In order to determine the optimal route in the routing space from a starting point to an ending point, distances must be assigned to each grid point in the routing space. FIG. 25 shows the distances which have been assigned to the first few steps from the starting point 130 to the ending point 132. After distances have been assigned, preferably the distances between every two neighboring grid points is summed. Preferably, a list of distances is maintained, and the list is sorted in ascending order by length. Preferably, one starts at the starting point 130 which has a route length of zero. For each grid point visited, the direction is considered. Preferably, the following steps are repeated until the ending point 132 is reached, or until there is an empty list of routes: 1) remove the first point list (corresponding to the starting point 130); 2) with regard to each neighbor that has not yet been visited, calculate the distance between the point and the neighbor; 3) put in the list each neighbor from the previous step, and from its route length use the route length to reach the current point plus the distance to the neighbor. When the ending point 132 is reached, preferably the route is retraced from the ending point 132 to the strating point 130. FIG. 26 illustrates a route 140 which has been determined using this process.

Depending on the application, there are usually two elements defined in a routing space—wires and vias. Each follows a different set of spacing rules. Before the blocks are defined in the routing space, it is important to know the wire width of the desired route. This is imporatnt because any calculation performed later will be based on that wire width.

With regard to any wire that will be created as a result of finding a route (see FIG. 26 for example), its center will be disposed on the top of an edge, either regular or boundary. Vias are created only at routing grid points (i.e. intersectiuons of regular edges). With regard to any wire created, the wire must have appropraite spacing from surrounding vias and wires. Additionally, with regard to any via created, the via must have appropraite spacing from surrounding vias and wires.

With regard to each, a wire and a via, a block is created to define the structure. To create a wire block, two numbers are calculated. The spacing which is required between the wire block and any eventual wire to be created is calculated. This number is the sum of the required spacing as per technology rules plus half of the routing wire width. This number actually represents the distance between the boundary of the wire block and the center of the routing wire. Additionally, the spacing which is required between the wire block and any eventual via to be created is calculated. This is the sum of the required spacing as per technology rules, plus half of the via size.

As shown in FIG. 27, with these two numbers calculated, a wire block is created as follows: 1) the wire block 149 is bloated by the wire spacing, by creating a rectangle 150 using boundary edges 152 pointing in a clockwise direction. All grid points and edges are assigned a property which may be called "NoVia", which indicates that no via can be created; and 2) the wire block is bloated by the via spacing, by creating a rectangle 154 using regular edges 156.

As shown in FIG. 28, via blocks are created in a similar way as wire blocks. The only difference is that via-to-wire spacing plus half wire width, and viato-via spacing plus half via size is used to bloat the actual via block.

Sources and targets are somewhat different than wire and via blocks. This is because there must be a way to go into the actual target, either to connect a wire to it, or place a via. As shown in FIG. 29, the source/target object is represented in a somewhat similar manner to the way a wire/via block is represented. However, one more rectangle 160 is introduced, where the rectangle 160 is actually the object's boundary, shrunk by half via size, made of bi-directional boundary edges 162. The internal rectangle 162 is designated either as "source" or "target". The surrounding boundary rectangle 154 is designated an attribute which mat be called "SourceNext", which identifies that there could be a source/target rectangle 160 inside. There are cases when there will be no source/target rectangle inside, for example as a result of merging a different block with the source/target. With this process, the problem can be solved of reaching the target with a via, and also having the target fully overlapped.

Next, as shown in FIG. 30, a slight modification is made to the regular edges. Specifically, the following rules are added: 1) if a boundary edge is reached, and the boundary edge is designated "SourceNext", a routing grid point is created and the regular edge being created continues; 2) if, at the current level, both ends of the edge are between two boundary edges, and both are marked as "Source/Target", or one is designated "Source/Target" and the other is designated "SourceNext", a bi-directional boundary edge is created and designated "NoVia". With this process, there is a safe way to reach a source/target from the same layer.

Besides boundary edges and regular edges, there is another type of edge called a "pin edge". Pin edges are very similar to boundary edges. The difference is the way in which they are created, and the purpose they serve. As with regular edges and boundary edges, pin edges are created between two points—a starting and ending point, however with these restrictions: 1) if there is some edge between the starting and ending point, a pin edge is created to the existing edge and not to the ending point (i.e. "normal" creation); 2) if at the ending point, there is no existing edge, no pin edge is created; 3) when processing the point, marked during creation of a boundary edge, a pin edge is treated as a regular edge, and is not taken into account.

Pin edges serve the purpose of defining a route inside a block, and are used when a point is created as source or target. Also, when a pin edge is created on a layer, on all the other layers, there will be created a regular edge, starting at the same location, ending at the routing space boundary, and using "forced" creation. The starting point of the pin edge is always marked as source or target and the edge is designated "NoVia".

To create a source/target point (i.e. a block representing a source/target point), the algorithm for creating a wire block is basically used, but is extended to provide a route to the actual block. Forming such a block is a two step process. As shown in FIG. 31, first a wire block 170 is created, with a square shape, with the same size as the wire width, and its center 172 is the source/target point. Then, as shown in FIG. 32, four pin edges 174 are created, starting at a specified point, going in four directions on a layer, and ending at the first boundary edge. The second rule for creating pin edges assures that if on any sides of the point, there is a block that merges with the block, no pin edge will be created. Hence, potential DRC errors will be avoided.

As shown in FIG. 33, typically there will be more than one layer of blocks. As shown, there may be three layers of blocks, wherein the bottom layer 180 will be called "Layer 0", the middle layer 182 will be called "Layer 1" and the top layer 184 will be called "Layer 2". An aspect of the present invention provides a method of merging the layers to provide the needed multi-layer representation. In order to be able to switch layers at routing time, points on adjacent layers must be linked. This is done at the time when new grid points are created. The layers above and below the point's layer are searched to locate the point on the other layers with the same coordinates, then the points are linked. So, if a block is copied on adjacent layers, a way to go up and down around any block is defined, and the block can be avoided.

On the first step, edges from a layer are merged to the layer above, starting with the bottom-most layer and moving upward. All newly created edges are formed as regular (undirected) edges. FIG. 34 shows the merging of Layer 0 (the bottom layer 180) to Layer 1 (the middle layer 182). As shown, this merging produces only three new edges 186 on that layer. FIG. 35 shows the merging of Layer 1 (the middle layer 182) to Layer 2 (the top layer 184).

Next, all layers must me merged down, using the same scheme as merging up. FIG. 36 shows the merging of Layer 2 (the top layer 184) to Layer 1 (the middle layer 182). FIG. 37 shows the merging of Layer 1 (the middle layer 182) to Layer 0 (the bottom layer 180). As shown, only one new rectangle 190 is created on Layer 0 (the bottom layer 180). So, using this method to merge the layers in the example shown in FIG. 33, wherein there are sixteen points and sixteen edges, eighteen new points are created as well as seventeen new edges to connect the points. FIG. 37 shows the fully defined routing space 200 after merging the layers.

To find a route in the routing space, preferred and wrong directions are assigned for each layer, as specified in the technology rules. Also, different costs are assigned for preferred and wrong directions as well as for going up or down. To incorporate this, while routing, the length of the step (see, for example, FIG. 25) is multiplied by the proper cost. At the end, this will result in finding the route with the lowest cost.

The way blocks are created in the above-described process (i.e. taking into account wire width, for example) provides that any wire that is created is automatically DRC "clean". In other words, there is no need to run DRC checks because the process takes technology rules into account in creating the blocks. Only the vias need a special check. When creating a via, it must be confirmed that the via has proper spacing with regard to the other objects. Since each object has a rectangle that defines where the first wire can be put (the boundary edges rectangle with a "NoVia" designation), and a rectangle that explicitly specifies the minimum distance where a via can be placed, it must be verified for the grid point on which a via is proposed to be placed that there is no other grid point that is designated "NoVia" and the distance is less than (half via size +via spacing—half wire width—wire spacing), which is exactly the distance between the two rectangles for each block. If there is no such point, it is safe to create a via. If there is such a point, no via should be created. In other words, if there is a point between the two rectangles, no via should be created there. It should be remembered that, in step two, each point is expanded so that one point is created on the boundary edge and one is created on the regular edge. Since this is relatively difficult to model when the rectangles are created, such a check is preferably incorporated as a runtime check during the route finding phase.

With the process described above, DRC clean routing is achieved. LVS clean routing is achieved automatically. Due to the way all the edges are created, there is no way a wire can be inadvertently connected to another object besides the source and target object.

To achieve maximum performance, it is preferred to choose the right data structure that will hold the information. Preferably, AVL trees are used (see Knuth, Donald, "The Art of Computer Programming", Vol. 3, pp. 458–475, for example) because AVL trees offer the maximum search performance, and they provide the ability to effectively walk-through all three operations that are performed while creating an edge and a search is made for the next edge which could intersect. Preferably, there are two tree-of-trees- for each layer. The first has the X-coordinate of each point as a key, and its member trees have the points' Y-coordinates as keys. The second has the Y-coordinate as key, and its trees use the X-coordinate as key.

Preferably, all functions are exported through an archive. A tool, tpi and silo archives can be used. A header file can also be maintained. Possible data structures, types, enums and defines are as follows:
struct pwroute_Table;
typedef struct pwroute_Table *pwroute_pTable;
typedef enum pwroute_Dir {
   pwroute_East=0x01,
   pwroute_West=0x02,
   pwroute_South=0x04,
   pwroute_North=0x08,
   pwroute_EastWest=pwroute_East|pwroute_West,
   pwroute_SouthEast=pwroute_East|pwroute_South,
   pwroute_NorthEast=pwroute_East|pwroute_North,
   pwroute_NorthSouth=pwroute_North|pwroute_South,
   pwroute_NorthWest=pwroute_North|pwroute_West,
   pwroute_SouthWest=pwroute_South|pwroute_West,

```
pwroute_Horizontal=pwroute_East|pwroute_West,
pwroute_Vertical=pwroute_North_|pwroute_South,
pwroute_Up=0x10,
pwroute_Down=0x20,
pwroute_UpDown=pwroute_Up|pwroute_Down
  }pwroute_Dir,
  typedef enum {
    pwroute_Source=0x08,
    pwroute_Target=0x10
  } pwroute_Attr;
  struct pwroute_RoutePoint;
  typedef struct pwroute_RoutePoint *pwroute_
    pRoutePoint;
  typedef struct pwroute_RoutePoint {
    intx;
    inty;
    const char*lname;
  } pwroute_RoutePoint;
C functions can be as follows:
int wroute_route(pwroute_pTable tbl, ma_group
  routeGroup, sll_list *routeList);
pwroute_pTabpwroute_createTable(int numLayers, int xa,
  int ya, int xb, int yb, int wir Width);
pwroute_pTable pwroute_createSlaveTable(pwroute_
  pTable tbl, int xa, int ya, int xb, int yb)
;
void pwroute_destroyTable(pwroute_pTable *table);
int pwroute_verifyTrees(pwroute_pTable tbl);
int pwroute_layerInit(pwroute_pTable tbl, int lindex, int
  lnum, const char *lname);
int pwroute_layerSetViaSpacing(pwroute_pTable tbl,
  const char *lname, int xspacing, int yspacing);
int pwroute_layerSetViaSize(pwroute_pTable tbl, const
  char *lname, int upxenclose, int upyenclose, int
  downxenclose, int downyenclose, int xholesize, int
  yholesize);
int pwroute_layerSetCost(pwroute_pTable tbl, const char
  *lname, int pwroute_layer cost);
int pwroute_layerSetPreferredDirection(pwroute_pTable
  tbl, const char *lname, pwroute_Dir d);
int pwroute_layerSetWireSpacing(pwroute_pTable tbl,
  const char *lname, int width, int spacing);
int pwroute_layerFindByName(pwroute_pTable tbl, const
  char *lname);
int pwroute_layerGetWireSpacing(pwroute_pTable tbl,
  const char *lname, int width);
int pwroute_layerGetViaXSpacing(pwroute_pTable tbl,
  const char *lname);
int pwroute_layerGetViaYSpacing(pwroute_pTable tbl,
  const char *lname);
int pwroute_layerGetMinViaXSize(pwroute_pTable tbl,
  const char *lname);
int pwroute_layerGetMinViaYSize(pwroute_pTable tbl,
  const char *name);
int pwroute_layerGetMaxViaXSpacing(pwroute_pTable
  tbl);
int pwroute_layerGetMaxViaYSpacing(pwroute_pTable
  tbl);
int pwroute_layerGetMaxViaXSize(pwroute_pTable tbl);
int pwroute_layerGetMaxViaYSize(pwroute_pTable tbl);
int pwroute_layerGetMaxViaXHalfSizeAndSpacing
  (pwroute_pTable tbl);
int pwroute_layerGetMaxViaYHalfSizeAndSpacing
  (pwroute_pTable tbl);
int pwroute_layerGetMaxViaXEnclose(pwroute_pTable
  tbl);
int pwroute_layerGetMaxViaYEnclose(pwroute_pTable
  tbl);
int pwroute_layerGetMinViaXEnclose(pwroute_pTable
  tbl);
int pwroute_layerGetMinViaYEnclose(pwroute_pTable
  tbl);
int pwroute_layerGetCostdnDir(pwroute_pTable tbl, int
  lnum, pwroute_Dir dir);
const char *pwroute_layerGetName(pwroute_pTable tbl,
  int lnum);
int pwroute_layerGetMinXEnclose(pwroute_pTable tbl,
  const char *lname);
int pwroute_layerGetMinYEnclose(pwroute_pTable tbl,
  const char *lname);
int pwroute_layerGetXHoleSize(pwroute_pTable tbl,
  const char *lname);
int pwroute_layerGetYHoleSize(pwroute_pTable tbl,
  const char *lname);
int pwroute_layerSetGridResolution(pwroute_pTable tbl,
  const char *lname, int xgrid, int yGrid);
int pwroute_layerDisableStacking(pwroute_pTable tbl, int
  disable);
int pwroute_isStackingDisabled(pwroute_pTable tbl);
int pwroute_createWireBlock(pwroute_pTable tbl, const
  char *lname, int xa, int ya, int xb, int yb, int
  useFatSpacing);
int pwroute_createViaBlock(pwroute_Table tbl, const char
  *lname, int xa, int ya, int xb, int yb);
int pwroute_createSourceTargetWire(pwroute_pTable tbl,
  const char *lname, int xa, int ya, int xb, int yb, pw
  route_Attr attr, int min ViaOverlap);
int pwroute_createPin(pwroute_pTable tbl, const char
  *lname, int xa, int ya, int xb, int yb, pwroute_Dir dir,
  pwroute_Attr attr);
int pwroute_createSourceTargetPoint(pwroute_pTable thl,
  const char *lname int xa, int ya, pwroute_Attr attr);
int pwroute_deleteSourceTargetPoint(pwroute_pTable tbl,
  const char *lname, int xa, int ya);
void pwroute_expandAllEdges(pwroute_pTable tbl, int
  force);
```

While an embodiment of the present invention is shown and described, it is envisioned that those skilled in the art may devise various modifications of the present invention without departing from the spirit and scope of the appended claims.

What is claimed is:

1. A software tool for routing a path from a source point to a target point in a routing space, said software tool configured to define boundaries of the routing space, define at least one block in the routing space, plot grid points in the routing space corresponding to corners of the at least one block which has been defined, plot the source point and target point, plot grid points in the routing space corresponding to the source and target points, and plot the path from the source point to the target point along grid points which have been plotted in the routing space.

2. A software tool as recited in claim 1, wherein said software tool is configured to define boundaries of a routing space which is at least one of square and rectangular.

3. A software tool as recited in claim 1, wherein said software tool is configured to define a plurality of blocks and process only those grid points which are necessary to define space in the routing space which is consumed by the plurality of blocks.

4. A software tool as recited in claim 1, wherein said software tool is configured to define corners of the blocks and deleting corners of blocks which are contained in other blocks.

5. A software tool as recited in claim 1, wherein said software tool is configured to plot grid points in the routing space corresponding to corners of the at least one block which has been defined by plotting grid points linearly in at least one direction within the routing space until intersecting at least one of a block which has previously been defined in the routing space or a boundary of the routing space which has previously been defined.

6. A software tool as recited in claim 1, wherein said software tool is configured to plot grid points in the routing space corresponding to the source and target points by plotting grid points linearly in at least one direction within the routing space until intersecting a boundary of the routing space which has previously been defined.

7. A software tool as recited in claim 1, wherein said software tool is configured to plot the path from the source point to the target point along grid points which have been plotted in the routing space by calculating the distance between a plurality of grid points to determine the path.

8. A software tool as recited in claim 1, wherein said software tool is configured to define blocks in the routing space corresponding to wires and vias.

9. A software tool as recited in claim 8, further comprising initially defining blocks in the routing space corresponding to wires and vias, and increasing the size of each of the blocks depending on whether each block corresponds to a via or a wire.

10. A software tool as recited in claim 1, wherein said software tool is configured to rout paths from source points to target points in routing spaces contained in a plurality of layers.

11. A method for routing a path from a source point to a target point in a routing space, said method comprising:
    defining boundaries of the routing space;
    defining at least one block in the routing space;
    plotting grid points in the routing space corresponding to corners of the at least one block which has been defined;
    plotting the source point and target point;
    plotting grid points in the routing space corresponding to the source and target points; and
    plotting the path from the source point to the target point along grid points which have been plotted in the routing space.

12. A method as recited in claim 11, wherein the step of defining boundaries of the routing space comprises defining boundaries of a routing space which is at least one of square and rectangular.

13. A method as recited in claim 11, wherein the step of defining at least one block in the routing space comprises defining a plurality of blocks and processing only those grid points which are necessary to define space in the routing space which is consumed by the plurality of blocks.

14. A method as recited in claim 11, wherein the step of defining at least one block in the routing space comprises defining corners of the blocks and deleting corners of blocks which are contained in other blocks.

15. A method as recited in claim 11, wherein the step of plotting grid points in the routing space corresponding to corners of the at least one block which has been defined comprises plotting grid points linearly in at least one direction within the routing space until intersecting at least one of a block which has previously been defined in the routing space or a boundary of the routing space which has previously been defined.

16. A method as recited in claim 11, wherein the step of plotting grid points in the routing space corresponding to the source and target points comprises plotting grid points linearly in at least one direction within the routing space until intersecting a boundary of the routing space which has previously been defined.

17. A method as recited in claim 11, wherein the step of plotting the path from the source point to the target point along grid points which have been plotted in the routing space comprises calculating the distance between a plurality of grid points to determine the path.

18. A method as recited in claim 11, further comprising defining blocks in the routing space corresponding to wires and vias.

19. A method as recited in claim 18, further comprising intially defining blocks in the routing space corresponding to wires and vias, and increasing the size of each of the blocks depending on whether each block corresponds to a via or a wire.

20. A method as recited in claim 11, further comprising routing paths from source points to target points in routing spaces contained in a plurality of layers.

* * * * *